(12) United States Patent
Khoury et al.

(10) Patent No.: US 12,336,336 B2
(45) Date of Patent: Jun. 17, 2025

(54) INDIUM-GALLIUM-NITRIDE LIGHT EMITTING DIODES WITH LIGHT REFLECTING MIRRORS

(71) Applicant: Applied Materials, Inc., Santa Clara, CA (US)

(72) Inventors: Michel Khoury, Santa Barbara, CA (US); Lan Yu, Albany, NY (US); Michael Chudzik, Mountain View, CA (US); Max Batres, Redwood City, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 17/195,271

(22) Filed: Mar. 8, 2021

(65) Prior Publication Data
US 2022/0285584 A1  Sep. 8, 2022

(51) Int. Cl.
*H10H 20/01*  (2025.01)
*H10H 20/825*  (2025.01)
(Continued)

(52) U.S. Cl.
CPC .......... *H10H 20/825* (2025.01); *H10H 20/01* (2025.01); *H10H 20/0137* (2025.01); *H10H 20/841* (2025.01); *H10H 20/855* (2025.01)

(58) Field of Classification Search
CPC .................. H01L 33/007; H10H 20/01335
(Continued)

(56) References Cited

U.S. PATENT DOCUMENTS

| 5,939,732 A * | 8/1999 | Kurtz ..................... H01L 33/34 |
| | | 257/77 |
| 2011/0186863 A1 | 8/2011 | Lee et al. |

(Continued)

FOREIGN PATENT DOCUMENTS

| EP | 2365543 A2 | 9/2011 |
| KR | 20070120342 A | 12/2007 |

(Continued)

OTHER PUBLICATIONS

Application No. PCT/US2022/017648, International Search Report and Written Opinion, Mailed on Jun. 13, 2022, 8 pages.
(Continued)

*Primary Examiner* — Hsin Yi Hsieh
(74) *Attorney, Agent, or Firm* — Kilpatrick Townsend & Stockton LLP (57) ABSTRACT

Exemplary processing methods of forming a semiconductor structure may include forming subpixels on a substrate. Each of the subpixels may include a gallium-and-nitrogen-containing layer formed on an exposed portion of a nucleation layer on the substrate. The subpixels may further include a porosified region formed on or in the gallium-and-nitrogen-containing region, and an active region formed on the porosified region. The active region may include an indium-gallium-and-nitrogen-containing material. The processing methods may further include forming a first reflection layer around one of the subpixels, wherein the first reflection layer includes a first metal layer. The methods may additionally include forming a second reflection layer around another of the subpixels, wherein the second reflection layer includes a second metal that is different than the first metal.

13 Claims, 8 Drawing Sheets

(51) Int. Cl.
　　　*H10H 20/841*　　(2025.01)
　　　*H10H 20/855*　　(2025.01)

(58) Field of Classification Search
　　　USPC .......................................................... 438/46
　　　See application file for complete search history.

(56) References Cited

U.S. PATENT DOCUMENTS

| | | |
|---|---|---|
| 2012/0299031 A1 | 11/2012 | Shiratori |
| 2013/0011656 A1 | 1/2013 | Zhang et al. |
| 2014/0061861 A1 | 3/2014 | Moustakas et al. |
| 2015/0372192 A1* | 12/2015 | Epler .............. H01L 33/32 257/76 |
| 2019/0053347 A1 | 2/2019 | Lee et al. |
| 2019/0088820 A1 | 3/2019 | Danesh et al. |
| 2019/0393379 A1 | 12/2019 | Armitage et al. |
| 2020/0227255 A1 | 7/2020 | Zhu et al. |
| 2022/0259766 A1* | 8/2022 | Chudzik .......... H01L 21/02458 |

FOREIGN PATENT DOCUMENTS

| | | |
|---|---|---|
| TW | 201925422 A | 7/2019 |
| WO | 02059982 A1 | 8/2002 |
| WO | 2021050731 A1 | 3/2021 |
| WO | 2021148803 A1 | 7/2021 |
| WO | 2021148808 A1 | 7/2021 |
| WO | 2021161005 A1 | 8/2021 |

OTHER PUBLICATIONS

Zhang, S., et al., "Efficient emission of InGaN-based light-emitting diodes: toward orange and red," Photonics Research, vol. 8, Issue 11, Nov. 2020, pp. 1671-1675. doi.org/10.1364/PRJ.402555.
Pasayat, S.S., et al. "Demonstration of ultra-small (<10 μm) 632 nm red InGaN micro-LEDs with useful on-wafer external quantum efficiency (>0.2%) for mini-displays", Applied Physics Express, vol. 14, No. 1 (Year 2021), 4 pages, doi.org/10.35848/1882-0786/abd06f.
Extended European Search Report for Application No. EP22767658.2, mailed Dec. 11, 2024, 9 pages.

* cited by examiner

INDIUM-GALLIUM-NITRIDE LIGHT EMITTING DIODES WITH LIGHT REFLECTING MIRRORS

TECHNICAL FIELD

The present technology relates to semiconductor processes and products. More specifically, the present technology relates to producing semiconductor structures and the devices formed.

BACKGROUND

Integrated circuits are made possible by processes which produce intricately patterned material layers on substrate surfaces. Producing patterned material on a substrate requires controlled methods for deposition and removal of materials. However, with new device designs, producing high quality layers of material may be challenging.

Thus, there is a need for improved systems and methods that can be used to produce high quality devices and structures. These and other needs are addressed by the present technology.

SUMMARY

The present technology includes exemplary semiconductor processing methods that may include forming subpixels on a substrate. Each of the subpixels may include a gallium-and-nitrogen-containing layer formed on an exposed portion of a nucleation layer on the substrate. The subpixels may further include a porosified region formed on or in the gallium-and-nitrogen-containing region, and an active region formed on the porosified region. The active region may include an indium-gallium-and-nitrogen-containing material. The methods may further include forming a first reflection layer around one of the subpixels, wherein the first reflection layer includes a first metal layer. The methods may additionally include forming a second reflection layer around another of the subpixels, wherein the second reflection layer includes a second metal that is different than the first metal.

In additional embodiments, the exemplary semiconductor processing methods may include forming a third reflection layer around still another of the subpixels, wherein the third reflection layer includes the first metal (i.e., the same metal found in the first reflection layer). In further embodiments, the methods may include removing the substrate from the subpixels. In still further embodiments, the methods may include forming optical structures on the subpixels, where the optical structures may be formed on each of the subpixels on an opposite side of the gallium-and-nitrogen-containing region as the active region. In yet further embodiments, the optical structures may be formed opposite the gallium-and-nitrogen-containing region on the nucleation layer. In still more embodiments, the first reflection layer may be formed on a blue-light-emitting-subpixel characterized by a peak light emission wavelength of less than or about 500 nm, and the second reflection layer may be formed on a red-light-emitting-subpixel characterized by a peak light emission wavelength of greater than or about 600 nm. In still further embodiments, the first metal in the first reflection layer may include aluminum, and the second metal in the second reflection layer may include copper.

The present technology also includes additional semiconductor processing methods that may include forming a gallium-and-nitrogen-containing region on a nucleation layer on a substrate. The methods may also include planarizing the gallium-and-nitrogen-containing region to form a planar portion of the gallium-and-nitrogen-containing region. The methods may still further include forming a porosified region in or on the planar portion of the gallium-and-nitrogen-containing region. In embodiments, an active region may be formed on the porosified region. In further embodiments, the active region may include an indium-gallium-and-nitrogen-containing material, and the active region may be characterized by a peak light emission wavelength greater than or about 400 nm. The methods may still further include forming a reflection layer on the active region, where the reflection layer includes a metal.

In further embodiments, the additional semiconductor processing methods may include forming the gallium-and-nitrogen-containing layer by selective area growth on an exposed portion of the nucleation layer that is exposed through a patterned mask layer formed on the nucleation layer. In still more embodiments, the planarizing of the gallium-and-nitrogen-containing region may include annealing the region to sublimate a portion of the region opposite the nucleation layer and to form the planar portion of the region. In yet additional embodiments, the porosified region may be formed by electrochemically etching an n-doped portion of the gallium-and-nitrogen-containing region or by electrochemically etching an n-doped layer formed on the gallium-and-nitrogen-containing region. In still further embodiments, the active region may be characterized by a peak light emission wavelength of less than or about 600 nm, and the metal in the reflection layer may include aluminum. In additional embodiments, the active region may be characterized by a peak light emission wavelength of greater than 600 nm, and the metal in the reflection layer may include copper.

The present technology further includes semiconductor structures that may include one or more subpixels. In embodiments, each of the subpixels may include a gallium-and-nitrogen-containing region formed on an exposed portion of a nucleation layer. Each subpixel may further include a porosified region formed on or in the gallium-and-nitrogen-containing region, and an active region formed on the porosified region. The active region may include an indium-gallium-and-nitrogen-containing material. Each subpixel may still further include a reflection layer formed on the active region and the gallium-and-nitrogen-containing region of the subpixel.

In additional embodiments, the gallium-and-nitrogen-containing region may include a gallium-and-nitrogen-containing material that is characterized by less than or about 15 mol. % indium. In still further embodiments, the nucleation layer may include at least one nitride material selected from the group consisting of AlN, NbN, TiN, and HfN. In yet more embodiments, the one-or-more-subpixels may include a first subpixel and a second subpixel. The metal in the reflection layer of the first subpixel may be a first metal, and the metal in the reflection layer of the second subpixel may be a second metal that is different than the first metal. In further embodiments, the first subpixel may be characterized by a first peak light emission wavelength that is less than or about 600 nm, and the first metal may include aluminum. In additional embodiments, the second subpixel may be characterized by a second peak light emission wavelength that is greater than 600 nm, and the second metal may include copper. In still additional embodiments, the one-or-more-subpixels may also include a third subpixel characterized by a third peak light emission wavelength that is less than or about 600 nm, and the metal in the reflection layer of the third subpixel may be the same as the metal in the first subpixel.

Such technology may provide numerous benefits over conventional semiconductor processing methods and structures. For example, embodiments of the processing methods and structures include a reflective layer formed on a subpixel that increases the amount of light emitted in a desired direction from the subpixel. The reflected light from the reflective layer may increase the total intensity of light emitted by the subpixel in the desired direction by greater than or about 10%. Embodiments of the processing methods and structures also include reflective layers made from different metals depending on the peak light emission wavelength of the subpixel. For example, subpixels characterized by peak light emission wavelengths in the blue and green part of the electromagnetic spectrum (e.g., wavelengths less than or about 600 nm) may include reflection layers made with aluminum, while subpixels characterized by peak light emission wavelengths in the red part of the spectrum may be made with copper. These and other embodiments, along with many of their advantages and features, are described in more detail in conjunction with the below description and attached figures.

BRIEF DESCRIPTION OF THE DRAWINGS

A further understanding of the nature and advantages of the disclosed technology may be realized by reference to the remaining portions of the specification and the drawings.

Several of the figures are included as schematics. It is to be understood that the figures are for illustrative purposes, and are not to be considered of scale unless specifically stated to be of scale. Additionally, as schematics, the figures are provided to aid comprehension and may not include all aspects or information compared to realistic representations, and may include exaggerated material for illustrative purposes.

In the appended figures, similar components and/or features may have the same reference label. Further, various components of the same type may be distinguished by following the reference label by a letter that distinguishes among the similar components. If only the first reference label is used in the specification, the description is applicable to any one of the similar components having the same first reference label irrespective of the letter.

DETAILED DESCRIPTION

Nitrides of Group III metals such as aluminum, indium, and gallium are promising materials for making light emitting diodes (LEDs) at micrometer scale (i.e., μLEDs). Unfortunately, the conversion efficiencies for these materials to translate the energy from electrical current into the emission of light is significantly below 1%, and far from uniform across the visible spectrum. LEDs made from indium-gallium-nitride-containing materials typically have peak quantum efficiencies below 30% across the visible spectrum. Another problem for indium-gallium-and-nitrogen-containing LEDs is that the quantum efficiency is not uniform between active regions tuned to emit light at blue, green, and red wavelengths. The LEDs are significantly more efficient at converting energy from electrical current into blue-colored light than red-colored light where peak quantum efficiencies are typically less than 5%. Consequently, a red-green-blue (RGB) pixel made from three subpixels of indium-gallium-and-nitrogen-containing materials use balancing conditions that either increase the intensity of light emission from the red subpixel, decrease the intensity of light emission from the blue subpixel, or both. Additional balancing conditions for the green subpixel, which has a conversion efficiency intermediate between the blue and red subpixels, may also be used.

The light emitted from the indium-gallium-and-nitrogen-containing active regions of the subpixels are generally isotropic and emit with equal intensity in all directions. In LED applications, the light the active regions emit toward the substrate normally do not provide usable light. This can result in up to half or more of the photons generated by the active regions of LED subpixels becoming non-usable light where the already low quantum efficiencies of these subpixels provide few photons to spare. In many cases, the non-useable light washes over into other subpixels in an issue known as subpixel crosstalk. This crosstalk can create a blue hue in a display caused by the higher intensity of light emitted by the subpixels with higher quantum efficiencies (e.g., blue subpixels in InGaN-containing LED displays).

The dominance of shorter-wavelength visible light in InGaN-containing LED displays is further increased by the broader spectrum of wavelengths emitted by active regions with peak light emissions at longer wavelengths (e.g., red-emitting active regions). This can give the red-subpixels a duller appearance than the green and blue subpixels that have significantly sharper peak light emission wavelength spectrum.

Embodiments of the present technology address the problems of low and varied quantum efficiencies in the indium-gallium-and-nitrogen-containing active regions of red, green, and blue, subpixels through the incorporation of different reflection layers in the subpixels. In additional embodiments of the present technology, different porosified regions may be included in the different red, green, and blue, subpixels. In yet further embodiments of the present technology, a bottom-up approach to the formation of subpixels may be used to reduce the number of non-radiative pathways available in the active regions for the energy provided by the charge carriers injected into the active regions. In still further embodiments, a combination of two or more of these approaches may be used to address the problems of low and varied quantum efficiencies in the indium-gallium-and-nitrogen-containing active regions of the red, green, and blue, subpixels.

Embodiments of the present technology address the problem of low efficiency in the generation of useful light by incorporating reflective layers into the subpixels of the LED that enhances the useable light extraction and can better meet the performance requirements of a device such as a display or other illuminable device or component. In embodiments, a reflection layer is formed on at least a portion of the subpixel that enhances light emitted from the subpixel in a manner that contributes to the illumination of the device. In further embodiments, at least a portion of the reflection layer may be formed on a surface of a subpixel that faces opposite an optical structure formed on the subpixel through which light passes that illuminates the device. In still further embodiments, the reflection layer increases the amount of useful light extracted from a subpixel's active region by greater than or about 5%, greater than or about 10%, greater than or about 15%, greater than or about 20%, greater than or about 25%, or more, compared to a similar subpixel that lacks the reflection layer.

The present technology also recognizes that the selection of material in the reflection layer may depend on the peak light emission wavelength of the active region in proximate to the reflection layer. For example, a reflection material such as copper is more reflective of visible light at longer wavelengths (e.g., red-colored wavelengths) than shorter wavelengths (e.g., green- and blue-colored wavelengths). In embodiments, reflection layers proximate to red-emitting active regions may be made of copper to increase the amount of useful light extracted from red-emitting subpixels. In embodiments, the copper reflection layers can also sharpen the spectrum of the peak light emission from a red-emitting subpixel, and increase the spectrum's peak emission wavelength. In further embodiments, reflection layers made of a metal such as aluminum may be used to extract more useful light from active regions characterized by shorter peak light emission wavelengths such as green and blue light.

Providing reflection layers made of different materials can help compensate for the differences in the conversions efficiencies of InGaN-containing, red, green, and blue, subpixels. Embodiments of the present technology further address this problem, as well as the low quantum efficiencies, by incorporating different porosified regions into the different-colored subpixels. The different porosified regions are used to accommodate the different amounts of indium incorporated into the active regions of the different-colored subpixels. A blue-light-emitting InGaN-containing subpixel normally uses the least amount of indium in the active region (e.g., less than or about 15 mol. % indium), while a red subpixel normally uses a greater amount (e.g., greater than or about 30 mol. %). For a series of InGaN-containing active regions formed on a GaN-containing layer having uniform porosity, the quantum efficiency of an active region decreases as the amount of indium incorporated into the layer increases.

Embodiments of the present technology can also address the problem of different conversion efficiencies of the red, green, and blue, InGaN-containing active regions by forming the different-color-emitting active regions on different porosified regions. As noted above, the increasing amount of indium progressing from blue- to red-light-emitting active regions creates an increased number defects and stress due to mismatches in the lattice structure at the interface of the active region and an adjacent gallium-and-nitrogen-containing layer. Embodiments of the present technology address can address this problem by incorporating porosified regions characterized by increasing levels of porosity going from the blue- to red-light-emitting active regions. The increased level of porosity the porosified region for a red-light-emitting active region helps reduce the level of stress and defects in the active region caused by the mismatches in the lattice structure between the active region and the gallium-and-nitrogen-containing region. The reduced stress and defects in the active regions due to the porosified region increases the overall quantum efficiency from these active regions as well as reduce the variation in quantum efficiencies between the blue- and red-light-emitting active regions.

Embodiments of the present technology can still further include a bottom-up approach to the formation of the subpixels to reduce the number of defects and non-illuminating energy transmission pathways in the subpixels' active regions. In embodiments, this bottom-up fabrication approach may include selectively growing gallium-and-nitrogen-containing regions on a nucleation layer that is formed on a wafer substrate. In embodiments, these selectively-grown gallium-and-nitrogen-containing regions may have a pyramidal shape with the apex of the pyramid pointing in the opposite direction of the nucleation layer that is in contact with the base of the pyramid. The pyramid-shaped gallium-and-nitrogen-containing regions may be annealed to sublimate a portion of the material from the apex of the pyramid and form a planar facet (sometimes called a c-facet) upon or in which the porosified region may be formed. In additional embodiments, the growth of the gallium-and-nitrogen-containing region may be halted before apex of the pyramid has formed, leaving a planar facet as the top surface of the region. The active region may then be formed on the porosified region, and the reflection layer may be formed on the active region (and may also be formed on other parts of the subpixel).

In embodiments, the porosifed region may be formed before the active region has been formed on the substrate structure. This allows a wider variety of porosification techniques to be used to make the porosified region more porous without concern about damaging the active region. It also permits greater variations in the porosity of the porosified region between the blue subpixels that may have little or no added porosity, and the red subpixels that may have more added porosity. Embodiments of the bottom-up fabrication approach also avoid the defects in sidewall surfaces of the components of the subpixel, including the active region, that occur during a conventional top-down, subtractive etching approach to forming the subpixel. Many conventional top-down etching processes can create many defects down the length of the sidewalls that can divert a significant portion of the electric current supplied to the active region into non-light emitting processes like phonon generation and heat. In many top-down etching processes, these losses to non-light emitting processes (e.g., Shokley-Read-Hall losses) can further increase with decreasing dimensions of an active region. Consequently, many conventional top-down fabrication processes that subtractively etch portions of the active regions and porosified regions to form subpixels with mesa-shaped active regions are characterized by low conversion efficiencies even after making the compliant layer porous. In embodiments of the bottom-up fabrication processes that may be characterized by non-etched, crystallographically-defined planes, fewer of these etch defects may be present, and the quantum efficiencies of the subpixels are higher.

Figure 1:
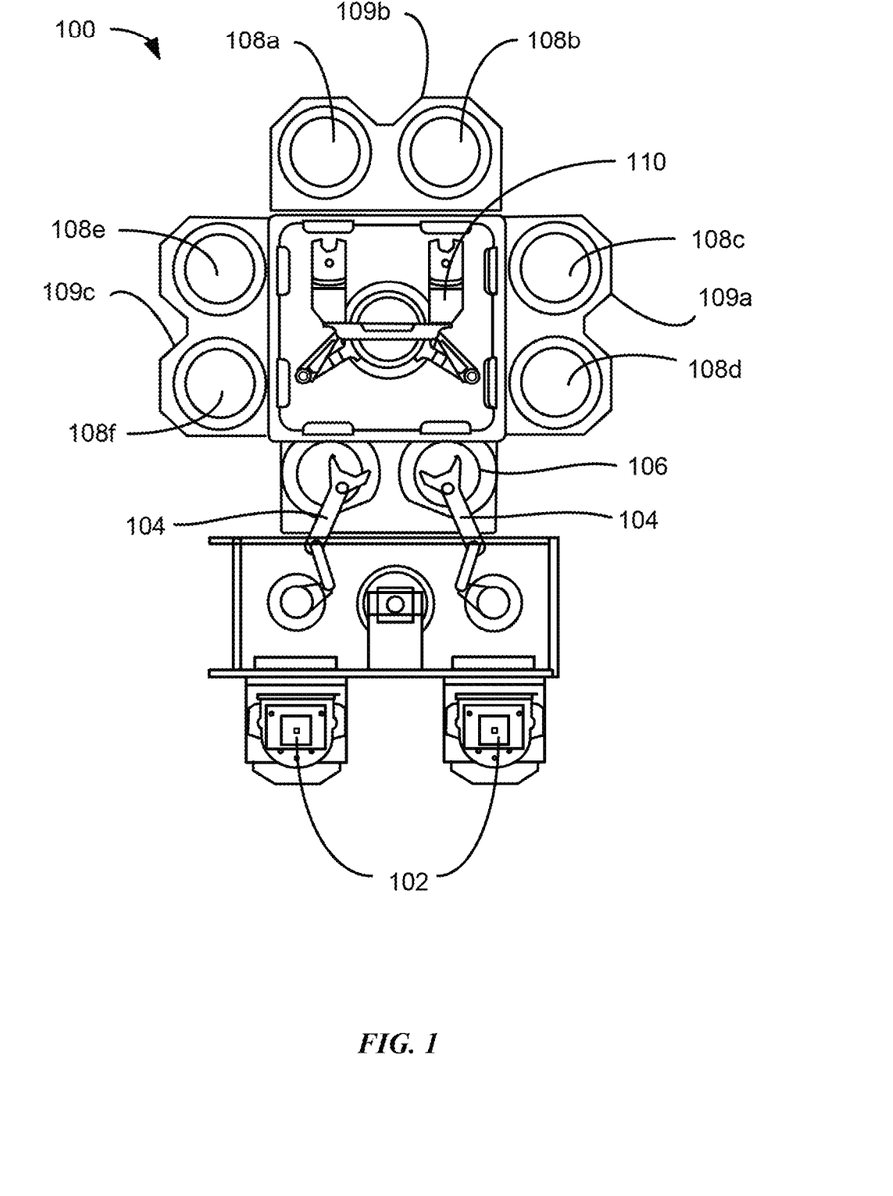
FIG. 1 shows a top plan view of one embodiment of an exemplary processing system according to some embodiments of the present technology.

FIG. 1 shows a top plan view of one embodiment of a processing system 100 of deposition, etching, baking, and curing chambers according to some embodiments of the present technology. In the figure, a pair of front opening unified pods 102 supply substrates of a variety of sizes that are received by robotic arms 104 and placed into a low pressure holding area 106 before being placed into one of the substrate processing chambers 108a-f, positioned in tandem sections 109a-c. A second robotic arm 110 may be used to transport the substrate wafers from the holding area 106 to the substrate processing chambers 108a-f and back. Each substrate processing chamber 108a-f, can be outfitted to perform a number of substrate processing operations including the dry etch processes described herein in addition to cyclical layer deposition, atomic layer deposition, chemical vapor deposition, physical vapor deposition, etch, pre-clean, anneal, plasma processing, degas, orientation, and other substrate processes.

The substrate processing chambers 108a-f may include one or more system components for depositing, annealing, curing and/or etching a material film on the substrate or wafer. In one configuration, two pairs of the processing chambers, for example 108c-d and 108e-f, may be used to deposit material on the substrate, and the third pair of processing chambers, for example 108a-b, may be used to cure, anneal, or treat the deposited films. In another configuration, all three pairs of chambers, for example 108a-f, may be configured to both deposit and cure a film on the substrate. Any one or more of the processes described may be carried out in additional chambers separated from the fabrication system shown in different embodiments. It will be appreciated that additional configurations of deposition, etching, annealing, and curing chambers for material films are contemplated by system 100. Additionally, any number of other processing systems may be utilized with the present technology, which may incorporate chambers for performing any of the specific operations. In some embodiments, chamber systems which may provide access to multiple processing chambers while maintaining a vacuum environment in various sections, such as the noted holding and transfer areas, may allow operations to be performed in multiple chambers while maintaining a particular vacuum environment between discrete processes.

Figure 2:
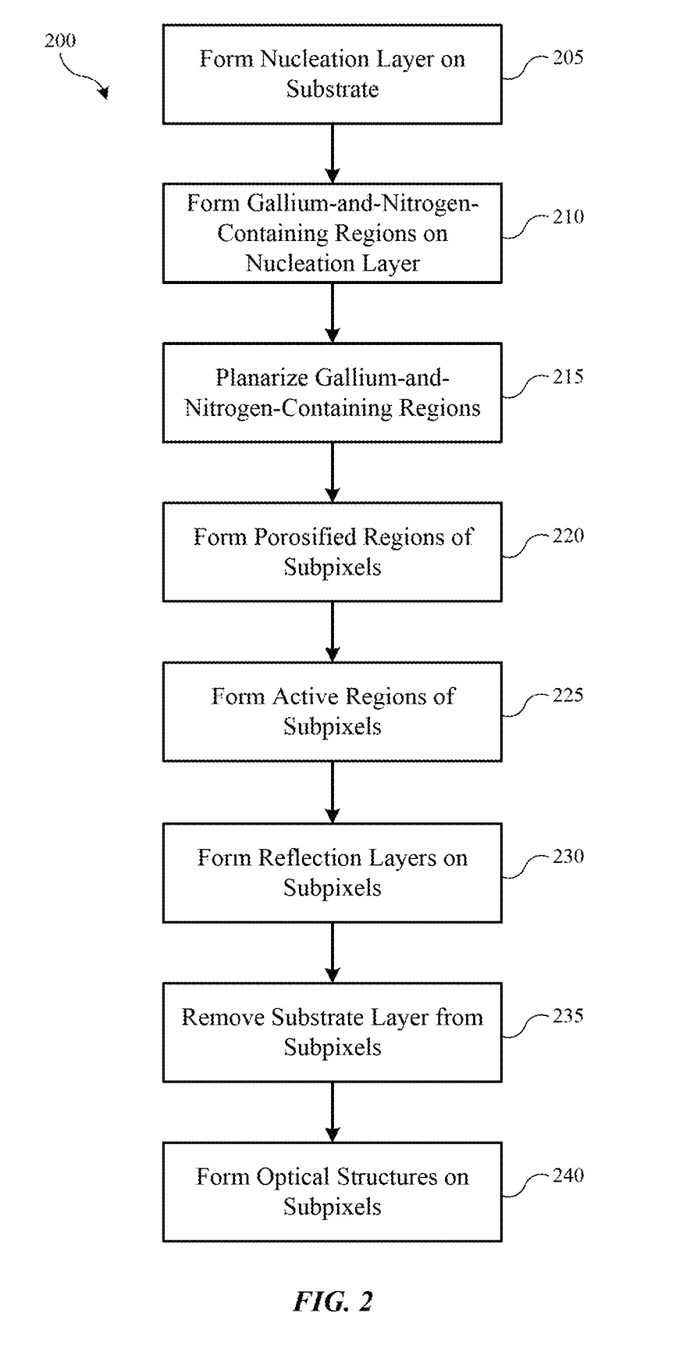
FIG. 2 shows exemplary operations in a method of forming semiconductor devices according to some embodiments of the present technology.

System 100, or more specifically chambers incorporated into system 100 or other processing systems, may be used to produce structures according to some embodiments of the present technology. FIG. 2 shows exemplary operations in a method 200 of forming a semiconductor structure according to some embodiments of the present technology. Method 200 may be performed in one or more processing chambers, such as chambers incorporated in system 100, for example. Method 200 may or may not include one or more operations prior to the initiation of the method, including front-end processing, deposition, etching, polishing, cleaning, or any other operations that may be performed prior to the described operations. The method may include a number of optional operations, which may or may not be specifically associated with some embodiments of methods according to the present technology. Method 200 describes operations shown schematically in FIGS. 3A-3I1 and FIGS. 4A-D, the illustrations of which will be described in conjunction with the operations of method 200. It is to be understood that FIGS. 3A-3I1 and FIGS. 4A-D illustrate only partial schematic views with limited details, and in some embodiments a substrate may contain any number of semiconductor sections having aspects as illustrated in the figures, as well as alternative structural aspects that may still benefit from any of the aspects of the present technology.

Figure 3A:
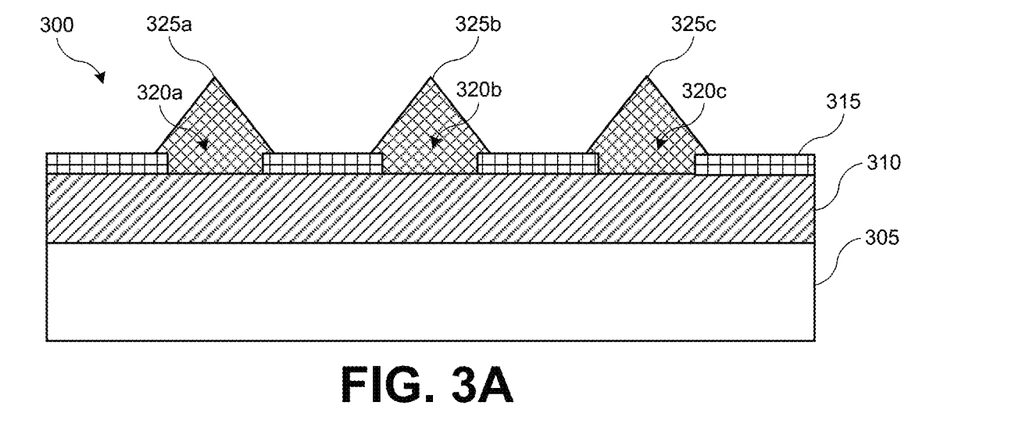
FIGS. 3A-3H show cross-sectional views of semiconductor structures being processed according to embodiments of the present technology.

Method 200 may involve operations to develop the semiconductor structure to a particular fabrication operation. Although in some embodiments method 200 may be performed on a base structure, in additional embodiments the method may be performed subsequent other material formation. As illustrated in FIG. 3A, the semiconductor structure may represent a device 300 after front-end or other processing has been completed. For example, substrate 305 may be a planar material, or may be a structured device, which may include multiple materials configured as posts, trenches, or other structures as would be understood are similarly encompassed by the present technology. Substrate 305 may include any number of conductive and/or dielectric materials including metals, including transition metals, post-transition metals, metalloids, oxides, nitrides, and carbides of any of these materials, as well as any other materials that may be incorporated within a structure. In some embodiments, substrate 305 may be or include silicon, which may be doped by any number of materials, as well as silicon-containing or gallium-containing materials. The doping may be n+ or n− in some operations, and the silicon may be formed or grown by any number of techniques. Additionally, in embodiments, one or more doped regions may be included in the substrate. For example any number of n- or p-doping regions may be included on the substrate.

Embodiments of method 200 may include the formation of a nucleation layer 310 on the substrate 305 at operation 205. The nucleation layer provides a surface to form gallium-and-nitrogen-containing regions that would otherwise take too long to form, or not form at all, on the underlying substrate 305. In embodiments, the nucleation layer 310 may include one or more metal nitrides such as aluminum nitride, niobium nitride, titanium nitride, or hafnium nitride, among other types of nitrides. In some embodiments, the nucleation layer may include gallium nitride. In embodiments, the nucleation layer 310 may be formed by physical vapor deposition (PVD) of the nucleation layer on the substrate. In further embodiments, the nucleation layer 310 may be characterized by a thickness greater than or about 5 nm, greater than or about 10 nm, greater than or about 25 nm, greater than or about 50 nm, greater than or about 100 nm, greater than or about 250 nm, greater than or about 500 nm, greater than or about 750 nm, greater than or about 1000 nm, greater than or about 1250 nm, greater than or about 1500 nm, greater than or about 1750 nm, greater than or about 2000 nm, or more.

In further embodiments, method 200 may include the formation of a mask layer 315 on the nucleation layer 310. In embodiments, the mask layer 315 may be made from one or more dielectric materials such as silicon oxide, silicon nitride, silicon carbide, amorphous carbon, or silicon-oxy-carbide, among other dielectric materials. The mask layer 315 may be patterned and etched at operation 215 to form openings 320a-c in the mask layer 315 that permit the growth gallium-and-nitrogen containing materials on the exposed portions of the nucleation layer 310.

In embodiments, the openings 320a-c in the patterned mask layer 315 permit the formation of red, green, and blue subpixels, which together may constitute a pixel in a light-emitting-diode display. A longest dimension of the openings 320a-c may be less than or about 10 µm, less than or about 5 µm, less than or about 1 µm, less than or about 0.9 µm, less than or about 0.8 µm, less than or about 0.7 µm, less than or about 0.6 µm, less than or about 0.5 µm, less than or about 0.4 µm, less than or about 0.3 µm, less than or about 0.2 µm, less than or about 0.1 µm, or less.

Method 200 may further include the forming of gallium-and-nitrogen-containing regions 325a-c in operation 210. The gallium-and-nitrogen-containing regions 325a-c may be formed in a bottom-up approach starting from the portions of the nucleation layer 310 exposed by the pattern openings 320a-c. In embodiments, the operation 210 to form the gallium-and-nitrogen-containing regions 325a-c may include the metal-organic chemical vapor deposition (MOCVD) of gallium-and-nitrogen-containing material on the surfaces of the nucleation layer 310 exposed to the MOCVD precursors. In further embodiments, these precursors may include one or more alkyl gallium compounds such as trimethylgallium or triethylgallium to provide the gallium component of the gallium-and-nitrogen-containing material that forms the regions. In additional embodiments, the precursors may also include ammonia ($NH_3$) to provide the nitrogen component of the gallium-and-nitrogen-containing regions 325a-c.

In still further embodiments, the gallium-and-nitrogen-containing regions 325a-c may include one or more additional components such as aluminum and indium. In these embodiments, the MOCVD precursors may further include one or more organo-aluminum compounds such as trimethyl-aluminum. In additional embodiments, the precursors may further include one or more alkyl indium compounds such as trimethyl indium. In embodiments, the mole ratio of the one or more additional components may be less than or about 15 mol. %, less than or about 12.5 mol. %, less than or about 10 mol. %, less than or about 9 mol. %, less than or about 8 mol. %, less than or about 7 mol. %, less than or about 6 mol. %, less than or about 5 mol. %, or less. For example, the gallium-and-nitrogen-containing regions 325a-c may include indium at a level less than or about 15 mol. %, less than or about 14 mol. %, less than or about 13 mol. %, less than or about 12 mol. %, less than or about 11 mol. %, less than or about 10 mol. %, less than or about 9 mol. %, less than or about 8 mol. %, less than or about 7 mol. %, less than or about 6 mol. %, less than or about 5 mol. %, less than or about 4 mol. %, less than or about 3 mol. %, less than or about 2 mol. %, less than or about 1 mol. %, or less.

In embodiments, the mole ratio of the nitrogen to the gallium, and other Group III metals, in the gallium-and-nitrogen-containing regions 325a-c may be adjusted through the flow rate of the nitrogen-containing precursors and the gallium-containing precursors. In further embodiments, the flow rate ratio of the nitrogen-containing precursors to the gallium-containing precursors may be greater than or about 50, greater than or about 100, greater than or about 500, greater than or about 1000, greater than or about 5000, greater than or about 10000, greater than or about 20000, greater than or about 30000, or more.

In additional embodiments, the gallium-and-nitrogen-containing regions 325a-c may be formed at temperatures selected for the deposition of the precursors on the exposed areas of the nucleation layer 310. In embodiments, the deposition temperature may be characterized as greater than or about 500° C., greater than or about 600° C., greater than or about 700° C., greater than or about 800° C., greater than or about 900° C., greater than or about 1000° C., greater than or about 1100° C., or more. In some embodiments, the deposition temperature for an gallium-and-nitrogen-containing material may adjusted based on the amount of additional components that are present in the material. In embodiments, a gallium-and-nitrogen-containing material that includes a significant amount of indium may be formed at a deposition temperature that is lower than an indium-free gallium-and-nitrogen-containing material. In additional embodiments, a gallium-and-nitrogen-containing material that further includes indium may be deposited at a deposition temperature less than or about 700° C., less than or about 650° C., less than or about 600° C., or less.

In further embodiments, the gallium-and-nitrogen-containing regions 325a-c may be formed at deposition pressures that facilitate the formation of the regions. In embodiments the gallium-and-nitrogen-containing regions 325a-c may be formed at deposition pressures greater than or about 10 Torr, greater than or about 50 Torr, greater than or about 100 Torr, greater than or about 200 Torr, greater than or about 300 Torr, greater than or about 400 Torr, greater than or about 500 Torr, greater than or about 600 Torr, greater than or about 700 Torr, or more.

In embodiments, the gallium-and-nitrogen-containing regions 325a-c may be formed with a pyramidal shape. In further embodiments, the base of the pyramid may be in contact with the nucleation layer 310, while the apex of the pyramid may point in a direction opposite the nucleation layer.

Figure 3B:
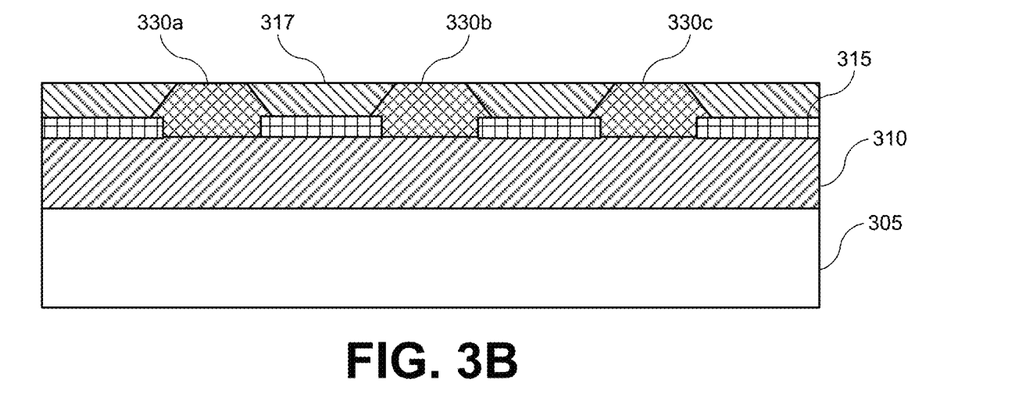

Method 200 may still further include planarizing the gallium-and-nitrogen-containing regions 325a-c in operation 215. In embodiments, the planarizing operation 215 may include a chemical-mechanical polishing process that is performed after forming a stop layer 317 on the mask layer 315 and the gallium-and-nitrogen-containing regions 325a-c. In further embodiments, the planarizing operation 215 may include an etching operation. In embodiments, the apex portion of the gallium-and-nitrogen-containing regions 325a-c may be wet etched or dry etched down to an etch-stop layer such as layer 317. In still further embodiments, the planarizing operation 215 may include an annealing process that sublimates off the apex of the pyramidal-shaped region to leave a planar region 330a-c (sometimes called a c-facet) at the top of the gallium-and-nitrogen-containing regions 325a-c, as shown in FIG. 3B. The planar regions 330a-c can create a stable base for the formation of subsequent components of a subpixel, including a compliant layer and an active region.

In embodiments, the annealing process may include heating the gallium-and-nitrogen-containing regions 325a-c in annealing gases for a designated period of time. In further embodiments, the gallium-and-nitrogen-containing regions 325a-c may be annealed at an annealing temperature greater than or about 900° C., greater than or about 1000° C., greater than or about 1100° C., or more. In still further embodiments, the gallium-and-nitrogen-containing regions 325a-c may be annealed in one or more annealing gases that may include at least one of ammonia or hydrogen ($H_2$). In still further embodiments, the gallium-and-nitrogen-containing regions 325a-c may be annealed for less than or about 10 minutes, less than or about 7.5 minutes, less than or about 5 minutes, or less.

Figure 3C:
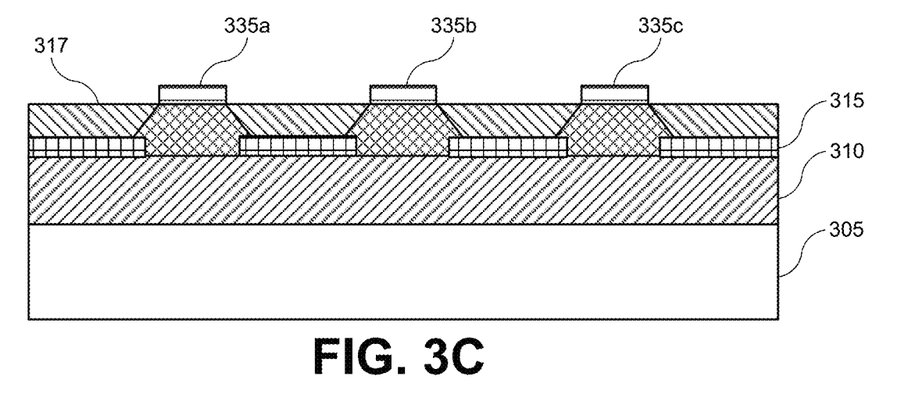

Method 200 may also include forming porosified regions of the subpixels in operation 220. In some embodiments, the porosified regions may be formed from pre-porosified layer 335a-c as shown in FIG. 3C. In additional embodiments, the porosified regions may be formed in the gallium-and-nitrogen-containing regions, including the planarized regions 330a-c. In still further embodiments, the porosified regions may be formed in both the pre-porosified layers and the planarized gallium-and-nitrogen-containing regions.

Referring to FIG. 3C, an embodiment of the present technology is shown where pre-porosified layers 335a-c are formed on the planar regions 330a-c of the planarized gallium-and-nitrogen-containing layers. In embodiments, the pre-porosified layers 335a-c may include gallium and nitrogen. In still further embodiments, the pre-porosified layers 335a-c include indium in addition to the gallium and the nitrogen. In additional embodiments, the pre-porosified layers 335a-c may have the same mole percentages of gallium and nitrogen as the planarized gallium-and-nitrogen-containing layers. In still additional embodiments, the pre-porosified layers 335a-c may have the same mole percentages of indium, gallium, and nitrogen, as the planarized gallium-and-nitrogen-containing layers that further include indium. In yet still further embodiments, the pre-porosified layers 335a-c may be characterized by the same chemical compositions as the planarized gallium-and-nitrogen-containing layers, but greater densities than the planarized gallium-and-nitrogen-containing layers.

In embodiments, the pre-porosified layers 335*a-c* may be formed in a bottom-up manner by first depositing and patterning a mask layer (not shown) on the planarized gallium-and-nitrogen-containing regions. In further embodiments, the patterned mask layer may include openings to reveal exposed portions of the planarized gallium-and-nitrogen-containing regions. In yet further embodiments, a blanket film of pre-porosified material may be deposited on the patterned mask layer. In still further embodiments, excess material in pre-porosified blanket film may be removed to form the pre-porosified layers 335*a-c*. Embodiments of the removal processes may include annealing and/or chemical-mechanical polishing of the as-deposited pre-porosified blanket film.

In embodiments, the pre-porosified layers 335*a-c* may be formed with MOCVD using the same or similar precursors and deposition conditions used to form the gallium-and-nitrogen-containing regions 325*a-c*. In further embodiments, where the pre-porosified layers 335*a-c* include indium, the mole percentage of indium in the pre-porosified layers 335*a-c* may be greater than or about 5 mol. %, greater than or about 6 mol. %, greater than or about 7 mol. %, greater than or about 8 mol. %, greater than or about 9 mol. %, greater than or about 10 mol. %, or more. In still additional embodiments, the amount of indium in the pre-porosified layers 335*a-c* may be the same as the amount of indium in the gallium-and-nitrogen-containing regions 325*a-c*. Under some conditions, when the mole percentage of indium in the pre-porosified layers 335*a-c* is similar to or the same as the mole percentage of indium in the gallium-and-nitrogen-containing regions 325*a-c*, the defects and stress in the pre-porosified layers 335*a-c* may be substantially reduced. In still further embodiments, the amount of indium in the pre-porosified layers 335*a-c* may be an intermediate amount between the amount of indium in the gallium-and-nitrogen-containing regions 325*a-c*, and the amount of indium in subsequently-formed active regions. In these embodiments, the pre-porosified layers 335*a-c* may help bridge the transition from the lower amounts of indium in the gallium-and-nitrogen-containing regions 325*a-c* to the higher amounts of indium in the active regions.

Figure 3D:
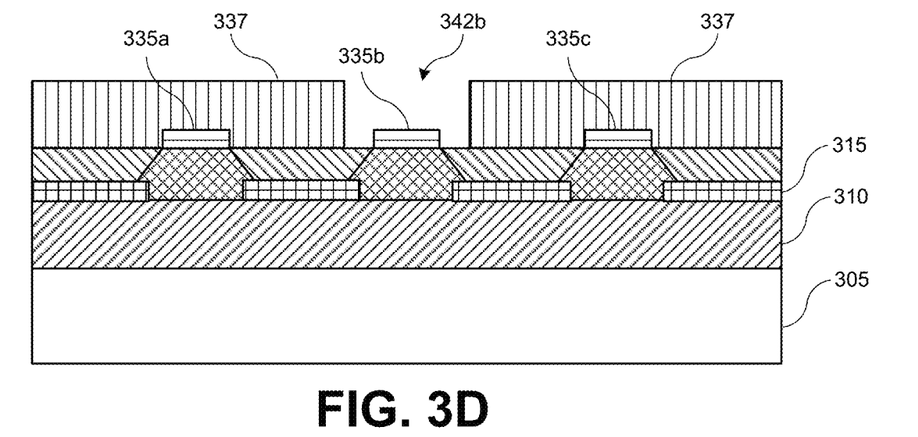
Figure 3E:
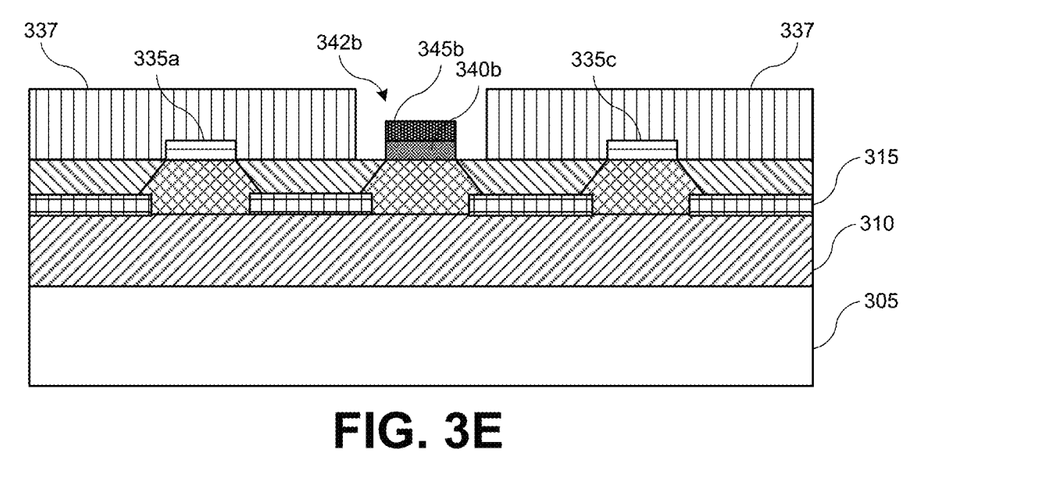
Figure 3F:
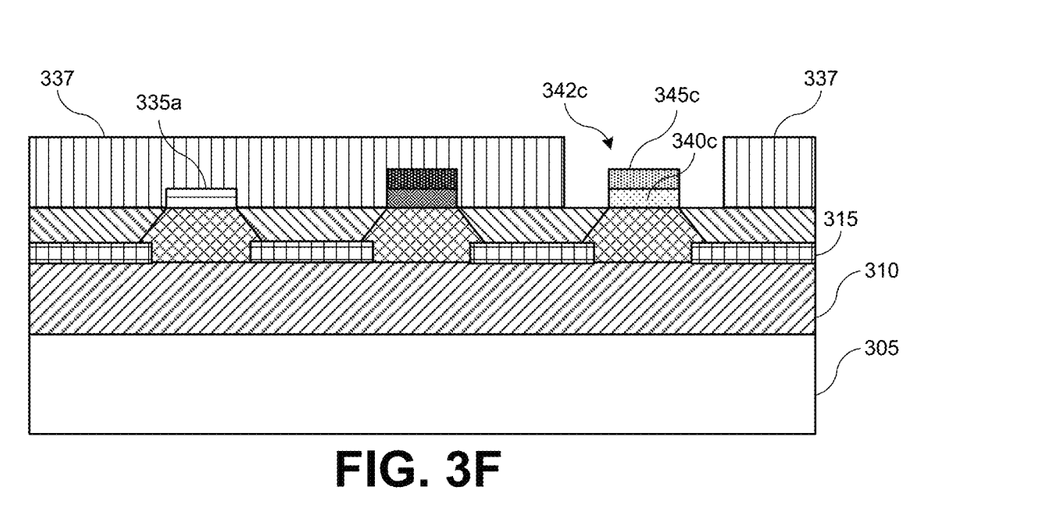
Figure 3G:
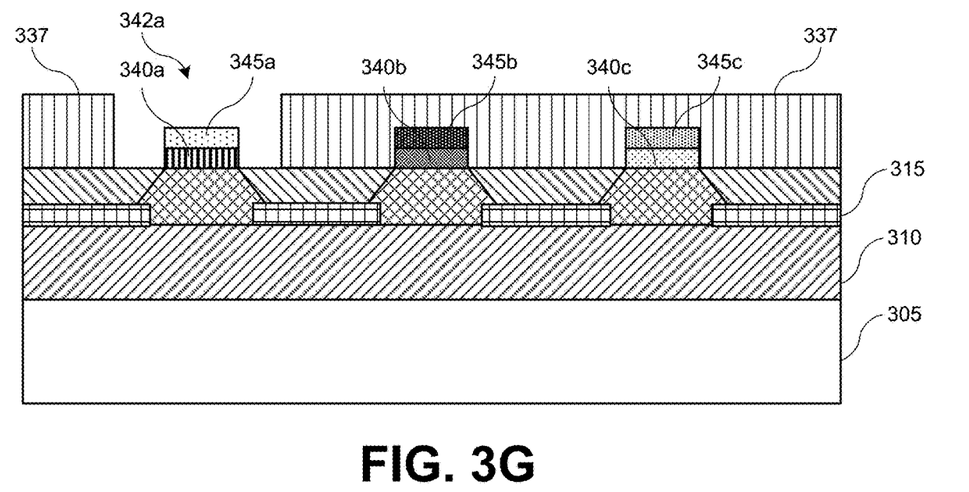

In embodiments, the pre-porosified layers 335*a-c* may be independently porosified to form the porosified regions 340*a-c*. In the embodiments illustrated in FIGS. 3D-G, each of the pre-porosified layers 335*a-c* is independently porosifed to form the porosified regions 340*a-c* using patterned mask layer 337 to select the pre-porosified layer undergoing a porosification operation. FIGS. 3D and 3E show the patterned mask layer 337 having mask opening 342*b* that exposes pre-porosified layer 335*b* during a porosification operation that forms porosified region 340*b*. While porosified region 340*b* is being formed the patterned mask layer 337 covers pre-porosified layers 335*a* and 335*c*, preventing them from forming porosified regions with the same porosity characteristics as porosified region 340*b*. FIG. 3F shows the patterned mask layer 337 subsequently having a mask opening 342*c* that exposes pre-porosified layer 335*c* during a porosification operation that forms porosified region 340*c*. In this embodiment, the patterned mask layer 337 covers both the porosified region 340*b* and the pre-porosified region 335*a*. FIG. 3G shows the patterned mask layer 337 having a mask opening 342*a* that exposes pre-porosified layer 335*a* while porosified regions 340*b* and 340*c* are covered by the mask layer.

In additional embodiments, the order of the porosification operations on pre-porosified layers 335*a-c* may be different than the order illustrated in FIGS. 3D-G. In other embodiments, the order of the porosification operations may start with the pre-porosified layer that is formed into the porosified region with the most added porosity (e.g., pre-porosified layer 335*c* formed into porosified region 340*c*) and end with the pre-porosified layer that is formed into the porosified region with the least added porosity (e.g., pre-porosified layer 335*a* formed into porosified region 340*a*). In some embodiments, an opening in the pattern mask layer 337 may remain opened while subsequent openings are formed in the mask layer to permit porosification operations on additional pre-porosified layers. In these embodiments, porosified regions formed in earlier porosification operations may receive additional porosification from the subsequent porosification operations.

Referring back to FIG. 3D, an embodiment is shown where one of the pre-porosified layer 335*b* is selectively exposed to porosification conditions to produce porosified region 340*b* shown in FIG. 3E. In embodiments, the formation of the porosified region 340*b* exposed by opening 342*b* may include the etching of porosity dopants in the pre-porosified layer 335*b*. The porosity dopants may increase a rate which porosity etchants can form pores in the doped regions. The porosity dopant level may be used to adjust the amount of porosity formed in the doped regions. In additional embodiments, the porosity dopants may include silicon (Si) incorporated into a portion of the planarized gallium-and-nitrogen-containing region 325*b*, the pre-porosified layer 335*b*, or both. In embodiments, the amount of incorporated silicon may be greater than or about $5\times10^{17}$ atoms/cm$^3$, greater than or about $1\times10^{18}$ atoms/cm$^3$, greater than or about $2\times10^{18}$ atoms/cm$^3$, greater than or about $3\times10^{18}$ atoms/cm$^3$, greater than or about $4\times10^{18}$ atoms/cm$^3$, greater than or about $5\times10^{18}$ atoms/cm$^3$, greater than or about $6\times10^{18}$ atoms/cm$^3$, greater than or about $7\times10^{18}$ atoms/cm$^3$, greater than or about $8\times10^{18}$ atoms/cm$^3$, greater than or about $9\times10^{18}$ atoms/cm$^3$, greater than or about $1\times10^{19}$ atoms/cm$^3$, or more.

In embodiments of the porosification operation 220, an electrochemical etch process may be used to expose the doped regions to an electrochemical etchant while a voltage differential is applied to at least pre-porosified layer 335*b*. In additional embodiments, the electrochemical etchant may be an acid such as oxalic acid or sulfuric acid. In further embodiments, the electrochemical etchant may be a base such as potassium hydroxide. In further embodiments, the voltage applied, or otherwise created, to the doped regions of at least the pre-porosified layer 335*b* may be greater than or about 1 volt, greater than or about 5 volts, greater than or about 10 volts, greater than or about 12.5 volts, greater than or about 15 volts, greater than or about 17.5 volts, greater than or about 20 volts, greater than or about 22.5 volts, greater than or about 25 volts, greater than or about 27.5 volts, greater than or about 30 volts, or more.

In embodiments, the porosification operation 220 may increase the void fraction a porosified region. The increased porosity of a porosified region may make its lattice structure more compliant with the formation of a subsequently-deposited active region that may be loaded with a significantly higher molar percentage of indium, among other differences. The more compliant porosified regions may enable fewer defects and less stress in the subsequently-deposited active region, which may significantly increase the quantum efficiency of the active region to convert the energy of electrical current into light.

Embodiments of porosification operation 220 may also include the adjustment of one or more porosification parameters for different doped regions to provide different levels of added porosity to each region or subset of regions. In further embodiments, one or more porosification parameters such as the doping level of a porosity dopant in each doped region, the electrochemical etching voltage applied to each doped region, the electrolyte concentration of the etching agent, the temperature of the etching agent, and the selective masking of doped regions may be used to vary the amount of added porosity for different porosified regions. In the embodiments shown, the porosified region 340b has less added porosity than the porosified region 340c. In further embodiments, the porosified region 340b may be characterized by a void fraction less than or about 30 vol. %, less than or about 25 vol. %, less than or about 20 vol. %, less than or about 15 vol. %, less than or about 10 vol. %, less than or about 5 vol. %, less than or about 1 vol. %, or less. In additional embodiments, the porosified region 340c may be characterized by a void fraction greater than or about 10 vol. %, greater than or about 15 vol. %, greater than or about 20 vol. %, greater than or about 25 vol. %, greater than or about 30 vol. %, greater than or about 35 vol. %, greater than or about 40 vol. %, greater than or about 45 vol. %, greater than or about 50 vol. %, greater than or about 55 vol. %, greater than or about 60 vol. %, or more.

In embodiments, the porosified region 340b may be used as a less-porous, compliant region for a green-light-emitting subpixel while the porosified region 340c may be used as a more-porous, compliant region for a red-light-emitting subpixel. An additional porosified region formed in pre-porosified layer 335a may be used in a blue-light emitting subpixel. This additional porosified region may have a smaller void fraction than the porosified region 340b, and in some embodiments may have no added porosity.

In embodiments, the formation of the porosified regions may be done before the deposition of the active regions as part of a bottom-up manner of fabricating the device 300. This permits the active regions to avoid some of the damage and contamination that may occur during porosification and further increase quantum efficiency for the device 300. In further embodiments, all of the pre-porosified layers may be porosified into the porosified regions before any of the active regions have been formed. In still further embodiments, some porosified regions, such as porosified region 340b, and active regions, such as active region 345b, may be formed before other porosified regions and active regions have been formed. In some of these embodiments, some of the pre-porosified layers, such as pre-porosifed layer 335b, may be formed by the selective exposure of some of the planarized gallium-and-nitrogen containing surfaces, such as planar region 330b.

Figure 3H:
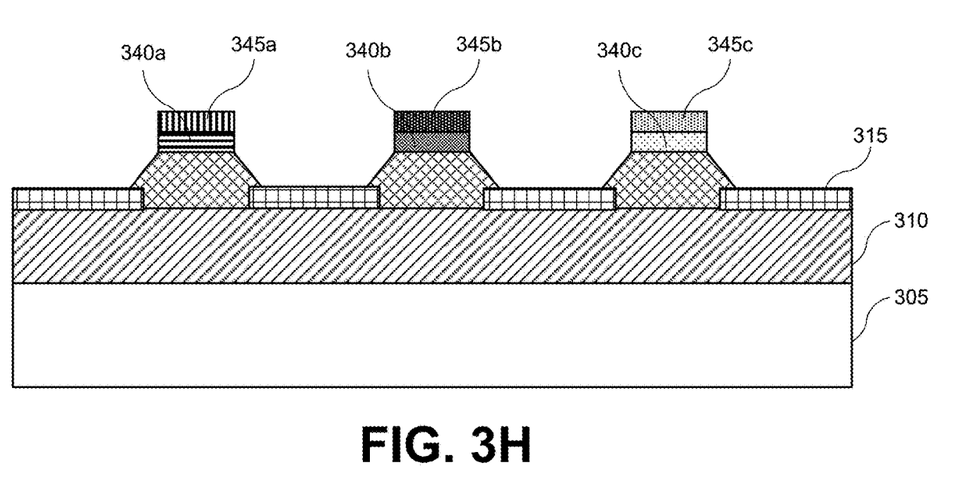

Method 200 may still further include an operation 225 to form the active regions of the subpixels that convert energy from a supplied electrical current into light. As illustrated in FIGS. 3F-H, the active regions 345a-c may be formed on the porosified regions 340a-c, and may be InGaN-containing layers that are formed with different mole percentages of indium to permit them to generate light at different wavelengths. In embodiments, the formation of the active regions 345a-c avoid sidewall etching of these regions as well as the previously-formed porosified regions 340a-c. This reduces at least a portion of the roughness and dislocations in the sidewalls that can create non-radiative sinks for the electrical current energy and reduce conversion efficiency.

In embodiments, the active region 345a may have a mole percentage of indium that is less than or about 18 mol. %, less than or about 17 mol. %, less than or about 16 mol. %, less than or about 15 mol. %, less than or about 14 mol. %, less than or about 13 mol. %, less than or about 12 mol. %, less than or about 11 mol. %, less than or about 10 mol. %, or less. This blue-emitting active region 345a may produce light characterized by a peak intensity wavelength of less than or about 500 nm, less than or about 490 nm, less than or about 480 nm, less than or about 470 nm, less than or about 460 nm, less than or about 450 nm, less than or about 440 nm, less than or about 430 nm, less than or about 420 nm, less than or about 410 nm, less than or about 400 nm, or less. In further embodiments, the active region 345c may have a mole percentage of indium that is greater than or about 30 mol. %, greater than or about 31 mol. %, greater than or about 32 mol. %, greater than or about 33 mol. %, greater than or about 34 mol. %, greater than or about 35 mol. %, greater than or about 36 mol. %, greater than or about 37 mol. %, greater than or about 38 mol. %, greater than or about 39 mol. %, greater than or about 40 mol. %, or more. This red-emitting active region 345c may produce light characterized by a peak intensity wavelength of greater than or about 600 nm, greater than or about 610 nm, greater than or about 620 nm, greater than or about 630 nm, greater than or about 640 nm, greater than or about 650 nm, greater than or about 660 nm, greater than or about 670 nm, greater than or about 680 nm, greater than or about 690 nm, or more. In yet further embodiments, the active region 345b may have an intermediate mole percentage of indium that is greater than the mole percentage indium in active region 345a and less than the mole percentage indium in the active region 345c. In further embodiments, the active region 345b may be characterized by a mole percentage of indium that is greater than or about 20 mol. %, and less than or about 25 mol. %. This green-emitting active region 345b may produce light characterized by a peak intensity wavelength greater than the peak intensity wavelength produced by active region 345a and less than the peak intensity wavelength produced by active region 345c. In embodiments, active region 345b may be characterized by the emission of light having a peak intensity wavelength about 530 nm.

In yet further embodiments, one or more of the active regions 345a-c may further include aluminum in addition to the indium, gallium, and nitrogen. In embodiments the AlInGaN-containing active regions 345a-c may have a mole percentage of aluminum that is less than or about 10 mol. %, less than or about 7.5 mol. %, less than or about 5 mol. %, less than or about 2.5 mol. %, less than or about 1 mol. %, or less. In further embodiments, the addition of aluminum may increase the quantum efficiency of active regions characterized by longer peak light emission wavelengths (e.g., red-light emitting active regions).

In embodiments, the method 200 may produce a red-light subpixel having an active region 345c with a higher quantum efficiency than produced with conventional, top-down fabrication methods. In embodiments, the external quantum efficiency of the red-emitting active region 345c may be greater than or about 0.1%, greater than or about 0.2%, greater than or about 0.3%, greater than or about 0.4%, greater than or about 0.5%, greater than or about 0.6%, greater than or about 0.7%, greater than or about 0.8%, greater than or about 0.9%, greater than or about 1%, greater than or about 5%, greater than or about 10%, greater than or about 20%, greater than or about 30%, greater than or about 40%, greater than or about 50%, greater than or about 60%, or more.

The method 200 may yet further include operation 230 to form reflection layers 350a-c on the active regions 345a-c and other components of the subpixels. Referring now to FIGS. 4A-D, a device embodiment is illustrated where a useful direction for the light emitted from the active regions 345a-c is in the direction of the nucleation layer 310, and the substrate 305 that will be removed from the subpixels in operation 235. In these embodiments, the operation 230 to form reflection layers 350a-c may include independent parts to form reflection layers 350a and 350b as part of the subpixels that include active regions 345a and 345b, and form reflection layer 350c as part of the subpixel that includes active region 345c. In embodiments, the reflection layers 350a and 350b may be formed from a first metal, and reflection layer 350c may be formed from a second metal. In further embodiments, the first metal may include aluminum and the second metal may include copper.

Figure 4A:
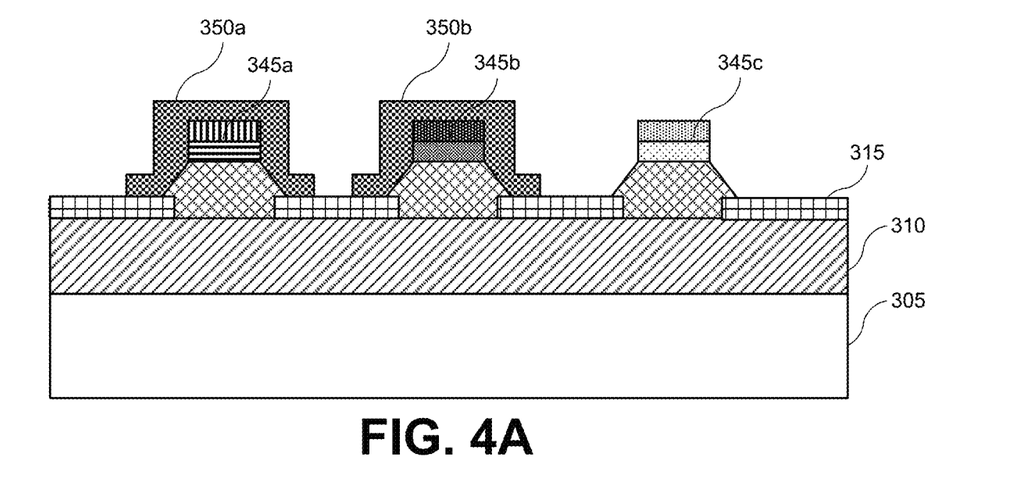
FIGS. 4A-D show additional cross-sectional views of semiconductor structures being processed according to embodiments of the present technology.
Figure 4B:
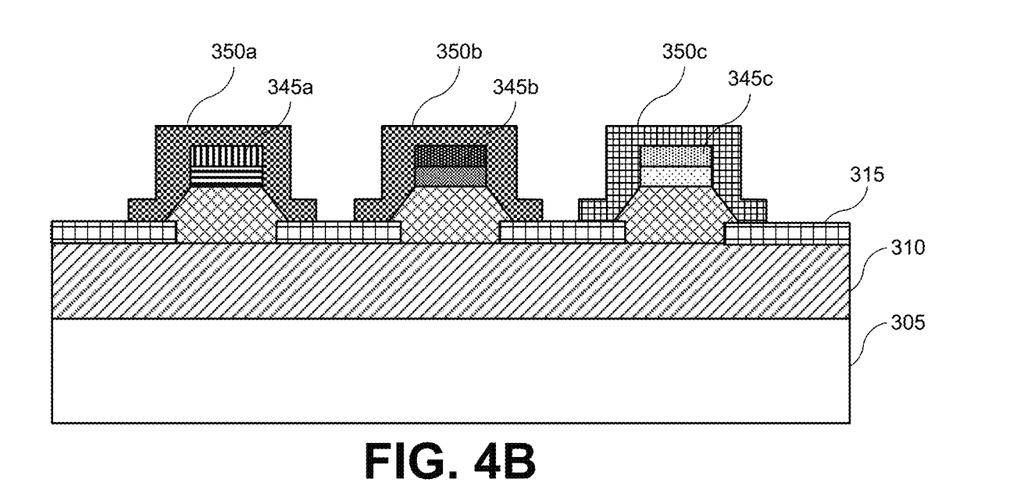

In additional embodiments, a transparent conductive oxide layer (not shown) may be formed on the active regions 345a-c prior to the formation of the reflection layers 350a-c on the active regions. In embodiments, the transparent conductive oxide layer may be made from a conductive materials such as indium-tin-oxide. In still further embodiments, the transparent conductive oxide layer provides an ohmic contact between the active regions 345a-c and the underlying gallium-and-nitrogen-containing regions 325a-c and other elements through which the charge carriers cycle through the active regions and cause light emission.

The present technology recognizes that reflection layers made of aluminum are more efficient at reflecting shorter wavelengths of visible light, such as blue and green light, than red light. It also recognizes that reflection layers made of copper are more efficient at reflecting red light than blue and green light. In embodiments, the reflections layers 350a and 350b may have a reflection efficiency of greater than or about 50%, greater than or about 60%, greater than or about 70%, greater than or about 80%, greater than or about 90%, greater than or about 95%, greater than or about 99%, or more, for reflecting light having wavelengths of less than or about 600 nm. In further embodiments, the reflection layer 350c may have a reflection efficiency of greater than or about 50%, greater than or about 60%, greater than or about 70%, greater than or about 80%, greater than or about 90%, greater than or about 95%, greater than or about 99%, or more, for reflecting light having wavelengths of greater than 600 nm, greater than or about 610 nm, greater than or about 620 nm, or more.

In embodiments, the reflection layers 350a-c direct a greater portion of the light emitted by active regions 345a-c into a direction that contributes to the illumination of a device such as a display or other illuminable device component. In further embodiments, the reflection layers may increase the intensity of light from a subpixel that illuminates a device by greater than or about 5%, greater than or about 10%, greater than or about 15%, greater than or about 20%, greater than or about 25%, or more, compared to a similar subpixel that lacks the reflection layer.

In further embodiments, the reflection layers 350a-c may be formed using physical vapor deposition, atomic layer deposition, thermal evaporation, e-beam evaporation, electroless plating, and electroplating, among other formation methods. The reflection layers 350a-c may be formed with thicknesses of less than or about 2000 nm, less than or about 1500 nm, less than or about 1000 nm, less than or about 500 nm, less than or about 250 nm, less than or about 100 nm, less than or about 50 nm, less than or about 25 nm, less than or about 20 nm, less than or about 15 nm, less than or about 10 nm, or less.

In additional embodiments, a barrier layer (not shown) may be formed on the active regions 345a-c to prevent the migration of metal from the reflection layers 350a-c into the active regions. In embodiments, the barrier layer may be made of materials that permit the passage of light between the active regions 345a-c and the reflection layers 350a-c. In further embodiments, the barrier layer may be made from at least one of titanium nitride and tantalum nitride. In more embodiments, the barrier layer may have a thickness that permits the passage of light between the active regions 345a-c and the reflection layers 350a-c. In embodiments, the barrier layer may be characterized by a thickness less than or about 15 nm, less than or about 12.5 nm, less than or about 10 nm, less than or about 7.5 nm, less than or about 5 nm, less than or about 2.5 nm, less than or about 2 nm, less than or about 1.5 nm, less than or about 1 nm, or less.

Figure 4C:
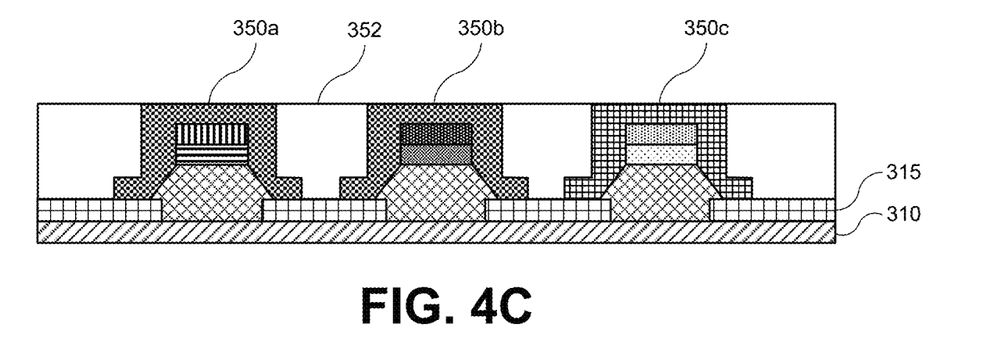

As noted above, method 200 may also include an operation 230 to remove the substrate layer from the subpixels. As illustrated in FIG. 4C, the substrate layer 305 may be removed to leave the nucleation layer 310 supporting the subpixels. A layer 352 is formed around the reflection layers 350a-c. In embodiments, the substrate layer 305 may be removed by grinding down the backside of a wafer upon which the substrate layer 305 is formed. In further embodiments, the substrate layer 305 may be removed by chemical etching, such as wet etching (e.g., etching in aqueous KOH), or dry etching (e.g., etching with $SF_6$). In yet further embodiments, the substrate layer 305 may be removed by a bulk removal process followed by chemical mechanical planarization of the remaining substrate layer. In additional embodiments, the substrate layer 305 (e.g., a sapphire-containing or glass-containing substrate layer) may be removed by laser lift-off.

Method 200 may yet also include an operation 235 to form optical structures 355a-c on the surface of the device where the substrate layer 305 was removed. In the embodiment illustrated in FIG. 4D, the optical structures 355a-c are formed on a portion of the nucleation layer 310 that was not removed with substrate layer 305. The optical structures 355a-c may focus the light emitted from the active regions 345a-c, and the light reflected from the reflection layers 350a-c. In embodiments, the emitted light may travel through the components of the subpixels including the active regions 345a-c, the porosified regions 340a-c, the gallium-and-nitrogen-containing regions 325a-c, the remaining portion of the nucleation layer 310 before being focused by the optical structures 355a-c. In additional embodiments, the optical structures may be formed from an optically transmissive material for the peak intensity wavelengths of light emitted by the subpixels. In embodiments, these transmissive materials may include optically-transparent oxides and optically-transparent polymers. In still additional embodiments, the optical structures may be formed by shaping the nucleation layer 310 (or an unremoved portion of the nucleation layer 310) to form the optical structures 355a-c. In yet further embodiments, the optical structure may be formed by shaping the gallium-and-nitrogen-containing regions 325a-c.

Figure 4D:
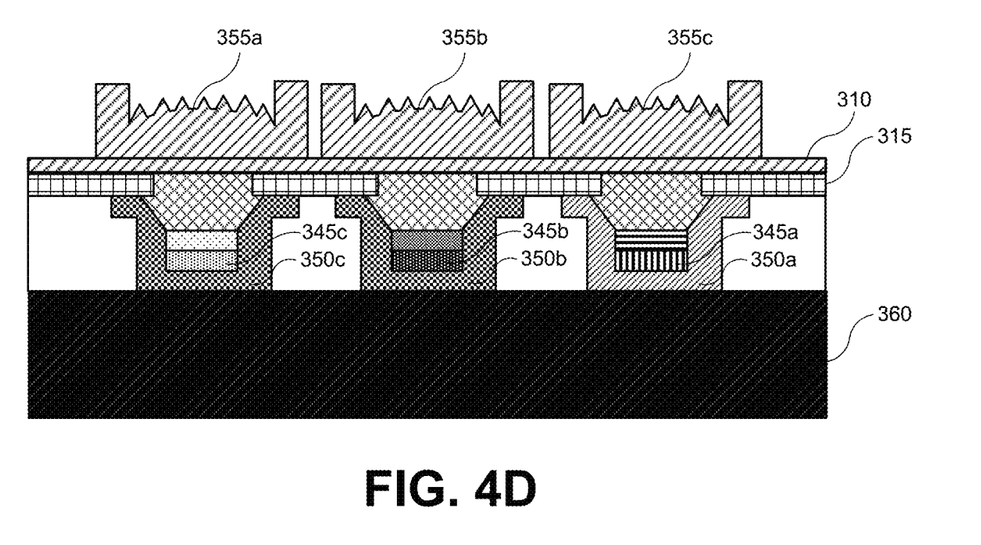

As illustrated in FIG. 4D, embodiments of the device 300 may still further include control circuitry 360 for activating each of the subpixels in the device. In embodiments, the control circuitry 360 may include switches for turning on and off the light emission from each of the subpixels. The control circuitry may further include electrically conductive lines (not shown) to supply charge carriers to and from the active regions 345a-c in order to stimulate light emission. In still further embodiments, the control circuitry may include a TFT or CMOS backplane for subpixel control. In yet further embodiments, the control circuitry may include additional circuit elements used in LED display backplanes.

In the preceding description, for the purposes of explanation, numerous details have been set forth in order to provide an understanding of various embodiments of the present technology. It will be apparent to one skilled in the art, however, that certain embodiments may be practiced without some of these details, or with additional details.

Having disclosed several embodiments, it will be recognized by those of skill in the art that various modifications, alternative constructions, and equivalents may be used without departing from the spirit of the embodiments. Additionally, a number of well-known processes and elements have not been described in order to avoid unnecessarily obscuring the present technology. Accordingly, the above description should not be taken as limiting the scope of the technology. Additionally, methods or processes may be described as sequential or in steps, but it is to be understood that the operations may be performed concurrently, or in different orders than listed.

Where a range of values is provided, it is understood that each intervening value, to the smallest fraction of the unit of the lower limit, unless the context clearly dictates otherwise, between the upper and lower limits of that range is also specifically disclosed. Any narrower range between any stated values or unstated intervening values in a stated range and any other stated or intervening value in that stated range is encompassed. The upper and lower limits of those smaller ranges may independently be included or excluded in the range, and each range where either, neither, or both limits are included in the smaller ranges is also encompassed within the technology, subject to any specifically excluded limit in the stated range. Where the stated range includes one or both of the limits, ranges excluding either or both of those included limits are also included.

As used herein and in the appended claims, the singular forms "a", "an", and "the" include plural references unless the context clearly dictates otherwise. Thus, for example, reference to "a trench" includes a plurality of such trenches, and reference to "the layer" includes reference to one or more layers and equivalents thereof known to those skilled in the art, and so forth.

Also, the words "comprise(s)", "comprising", "contain(s)", "containing", "include(s)", and "including", when used in this specification and in the following claims, are intended to specify the presence of stated features, integers, components, or operations, but they do not preclude the presence or addition of one or more other features, integers, components, operations, acts, or groups.

The invention claimed is:

1. A semiconductor processing method comprising:
forming subpixels on a substrate, wherein each of the subpixels comprises:
a gallium-and-nitrogen-containing region formed on an exposed portion of a nucleation layer on the substrate;
a porosified region formed on or in the gallium-and-nitrogen-containing region; and
an active region formed on the porosified region, wherein the active region comprises an indium-gallium-and-nitrogen-containing material;
forming a first reflection layer around subpixels characterized by a peak light emission wavelength of less than or about 500 nm, wherein the first reflection layer comprises a first metal; and
forming a second reflection layer around subpixels characterized by a peak light emission wavelength of greater than or about 600 nm, wherein the second reflection layer comprises a second metal that is different than the first metal, the first metal is more efficient at reflecting blue and green light than red light, and the second metal is more efficient at reflecting red light than blue and green light.

2. The semiconductor processing method of claim 1, wherein the method further comprises removing the substrate from the subpixels.

3. The semiconductor processing method of claim 1, wherein the method further comprises forming optical structures on the subpixels, wherein the optical structures are formed on each of the subpixels on the gallium-and-nitrogen-containing region.

4. The semiconductor processing method of claim 3, wherein the optical structures are formed on the nucleation layer.

5. The semiconductor processing method of claim 1, wherein the first reflection layer is formed on a blue-light-emitting-subpixel, and the second reflection layer is formed on a red-light-emitting-subpixel.

6. The semiconductor processing method of claim 1, wherein the first metal comprises aluminum.

7. The semiconductor processing method of claim 1, wherein the second metal comprises copper.

8. A semiconductor processing method comprising:
forming a gallium-and-nitrogen-containing region on a nucleation layer on a substrate;
planarizing the gallium-and-nitrogen-containing region to form a planar portion of the gallium-and-nitrogen-containing region;
forming a porosified region in or on the planar portion of the gallium-and-nitrogen-containing region;
forming an active region on the porosified region, wherein the active region comprises an indium-gallium-and-nitrogen-containing material, and is characterized by a peak light emission wavelength greater than or about 400 nm, and wherein a porosity of the porosified region is selected based on the peak light emission wavelength of the active region such that the porosity is less-porous when the peak light emission wavelength is characterized as red-light emitting and more-porous when the peak light emission wavelength is characterized as green light emitting; and
forming a reflection layer on the active region, wherein the reflection layer comprises a metal.

9. The semiconductor processing method of claim 8, wherein the gallium-and-nitrogen-containing region is formed by selective area growth on an exposed portion of the nucleation layer exposed through a patterned mask layer formed on the nucleation layer.

10. The semiconductor processing method of claim 8, wherein the planarizing of the gallium-and-nitrogen-containing region comprises annealing the gallium-and-nitrogen-containing region to sublimate a portion of the gallium-and-nitrogen-containing region and to form the planar portion of the gallium-and-nitrogen-containing region.

11. The semiconductor processing method of claim 8, wherein the porosified region is formed by electrochemically etching an n-doped portion of the gallium-and-nitrogen-containing region or by electrochemically etching an n-doped layer formed on the gallium-and-nitrogen-containing region.

12. The semiconductor processing method of claim 8, wherein the active region is characterized by a peak light emission wavelength of less than 600 nm, and the metal in the reflection layer comprises aluminum.

13. The semiconductor processing method of claim 8, wherein the active region is characterized by a peak light emission wavelength of greater than 600 nm, and the metal in the reflection layer comprises copper.

* * * * *